(12) United States Patent
Weitz

(10) Patent No.: US 6,933,866 B1
(45) Date of Patent: Aug. 23, 2005

(54) VARIABLE DATA RATE RECEIVER

(75) Inventor: John C. Weitz, Belmont, CA (US)

(73) Assignee: Avid Technology, Inc., Tewksbury, MA (US)

( * ) Notice: Subject to any disclaimer, the term of this patent is extended or adjusted under 35 U.S.C. 154(b) by 0 days.

(21) Appl. No.: 10/940,031

(22) Filed: Sep. 14, 2004

(51) Int. Cl.$^7$ ............................................... H03M 7/12
(52) U.S. Cl. .............................. 341/71; 341/68; 341/50
(58) Field of Search .............................. 341/71, 70, 50, 341/68, 69

(56) References Cited

U.S. PATENT DOCUMENTS

| | | |
|---|---|---|
| 4,287,596 A | 9/1981 | Chari |
| 4,468,791 A | 8/1984 | Masek |
| 4,547,754 A | 10/1985 | Murakami et al. |
| 4,683,571 A | 7/1987 | Yamagishi |
| 4,853,943 A | 8/1989 | Laws |
| 5,134,632 A | 7/1992 | Fletcher et al. |
| 5,280,394 A | 1/1994 | Murabayashi et al. |
| 5,329,556 A | 7/1994 | Meitner et al. |
| 5,404,362 A | 4/1995 | Meitner |
| 5,446,765 A | 8/1995 | Leger |
| 5,465,268 A | 11/1995 | Rainbolt |
| 5,598,423 A | 1/1997 | Meitner |
| 5,706,001 A | 1/1998 | Sohn ........................... 341/50 |
| 5,822,326 A | 10/1998 | Rainbolt |
| 5,857,044 A | 1/1999 | Ogawa et al. ................. 386/62 |

(Continued)

Primary Examiner—Lam T. Mai
(74) Attorney, Agent, or Firm—Peter J. Gordon

(57) ABSTRACT

A clock signal and data is recovered from a variable rate signal including biphase mark encoded digital audio data. Such recovery involves regularly determining a minimum or maximum pulse width in the biphase mark encoded digital audio data using a high frequency clock. This pulse width is used to define a window in which a transition in the biphase mark encoded digital audio data may be detected. If a transition occurs in the defined window, a data one is output; if a transition does not occur in the defined window, a data zero is output. The recovered clock has a period of twice the minimum pulse width. A minimum or maximum pulse width can be tracked with an accumulator with decay. In particular, if the data rate of the input signal becomes faster, the shortest pulse will become shorter and a minimum value stored by the accumulator will become shorter. If the data rate of the input signal becomes slower, the longest pulse will become longer and any maximum value stored by the accumulator will become longer. However, if a minimum is stored and the input signal becomes slower, or if a maximum is stored and the input signal becomes faster, the stored minimum or maximum values would not otherwise change. By incorporating decay, the stored value changes over time towards a larger value (if a minimum is stored) or a smaller value (if a maximum is stored) to a limit. By regularly updating the determined minimum or maximum pulse width, the rate of the input signal may vary over time and still permit recovery of the clock and data signals. By using a window in which a transition is detected, jitter in the input signal is tolerated and gradual changes in input rate may be tracked.

8 Claims, 2 Drawing Sheets

U.S. PATENT DOCUMENTS

| | | |
|---|---|---|
| 5,889,820 A | 3/1999 | Adams |
| 6,061,410 A | 5/2000 | Linz .......................... 341/50 |
| 6,226,758 B1 | 5/2001 | Gaalaas et al. |
| 6,249,555 B1 | 6/2001 | Rainbolt |
| 6,487,263 B1 | 11/2002 | Bianchessi et al. |
| 6,573,759 B2 | 6/2003 | Shuholm |
| 6,759,974 B1 | 7/2004 | Herr .......................... 341/50 |
| 6,768,433 B1 | 7/2004 | Toth et al. |
| 6,822,588 B1 | 11/2004 | Marshall et al. .............. 341/50 |

VARIABLE DATA RATE RECEIVER

BACKGROUND

Biphase mark encoding is a commonly used format for transmitting data. Using biphase mark encoded data, synchronization or clock data may be extracted from the data without requiring separate transmission of a clock signal.

Several standards use biphase mark encoding. For example, the Audio Engineering Society (AES) has set forth a standard format for biphase mark encoding of digital audio signals often referred to as AES-3. This standard is defined in a document called "AES Recommended practice for digital audio engineering—Serial transmission format for two channel linearly represented digital audio data." An example form of an AES-3 signal is described in more detail below. The AES-3 specification applies to signals sent over balanced twisted-pair cabling. A similar encoding of digital audio signals is used in SPDIF (Sony Philips Digital Interface).

Under AES-3, actual data rates may be variable. Different systems may have different fixed data rates and one system may use multiple data rates over time. Therefore, conventional designs for AES-3 receivers use analog phase-locked loops to recover clock, data and audio sample synchronization signals. Less expensive digital designs for AES-3 receivers generally have been limited to a receiving input signals having a single, fixed frequency, making them inapplicable to environments in which variable data rates are actually used.

As with most clocked data signals that are transmitted, jitter may arise due to a variety of factors. This prospect of jitter introduction limits, for example, the length or other characteristics of a transmission medium that may be used. Any clock and data recovery scheme should take into account the possibility of jitter that has been introduced in the received signal.

SUMMARY

A clock signal and data is recovered from a variable rate signal including biphase mark encoded digital audio data. Such recovery involves regularly determining a minimum or maximum pulse width in the biphase mark encoded digital audio data using a high frequency clock. This pulse width is used to define a window in which a transition in the biphase mark encoded digital audio data may be detected. If a transition occurs in the defined window, a data one is output; if a transition does not occur in the defined window, a data zero is output. The recovered clock has a period of twice the minimum pulse width.

A minimum or maximum pulse width can be tracked with an accumulator with decay. In particular, if the data rate of the input signal becomes faster, the shortest pulse will become shorter and a minimum value stored by the accumulator will become shorter. If the data rate of the input signal becomes slower, the longest pulse will become longer and any maximum value stored by the accumulator will become longer. However, if a minimum is stored and the input signal becomes slower, or if a maximum is stored and the input signal becomes faster, the stored minimum or maximum values would not otherwise change. By incorporating decay, the stored value changes over time towards a larger value (if a minimum is stored) or a smaller value (if a maximum is stored) to a limit.

By regularly updating the determined minimum or maximum pulse width, the rate of the input signal may vary over time and still permit recovery of the clock and data signals. By using a window in which a transition is detected, jitter in the input signal is tolerated and gradual changes in input rate may be tracked.

DETAILED DESCRIPTION

In a biphase mark encoded signal, each bit in a bitstream to be transmitted is represented by a symbol comprising two consecutive binary states. The first state of a symbol is always different from the second state of the previous symbol in the bitstream. If the bit is zero, then the second state of the symbol is identical to the first state. If the bit is one, then the second state of the symbol is different from the first state. An example biphase mark encoded signal is the encoded digital audio data in an AES-3 compliant signal.

Figure 1:
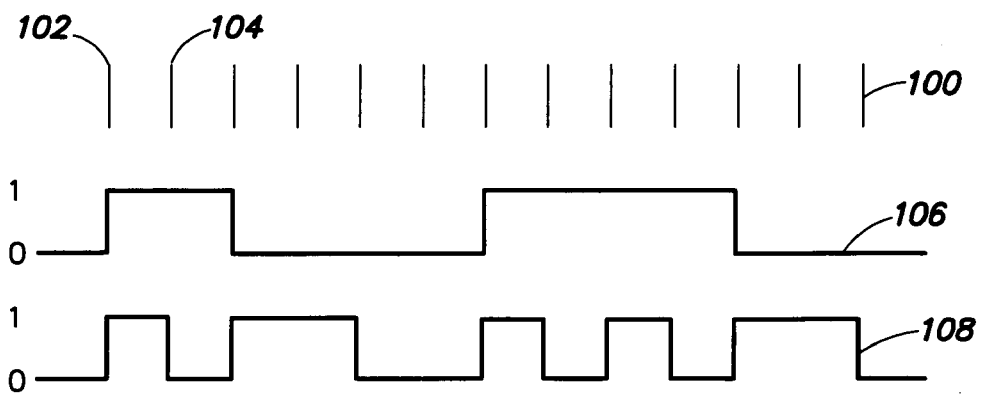
FIG. 1 is an illustration of an example biphase mark encoded signal.

As an example, FIG. 1 (which is shown in the AES-3 Specification) explains a biphase mark encoded signal. In particular, a clock signal is represented at 100 and includes rising and falling edges at 2 times the bit rate. Each edge, e.g., 102, 104, represents a rising or falling edge of the clock signal. The binary data to be encoded is illustrated at 106. In particular, the bit stream 1001100 is shown by the signal at 106. This bitstream is encoded using biphase mark encoding to create the signal shown at 108.

Because of the characteristics of a biphase mark signal, the shortest pulse in the biphase mark signal represents one state of a symbol representing a one bit. Both states of a symbol representing a zero bit are the same, and thus a zero bit is twice as long as the shortest pulse. Because a zero bit symbol is followed by a pulse in the opposite state, the zero-bit represents the longest pulse in a biphase mark encoded bitstream. Because of the characteristics of the AES-3 preamble, however, an AES-3 preamble will include the longest pulse in an AES-3 bitstream, which is three times the length of the shortest pulse in the biphase mark encoded data of the AES-3 signal. The characteristic pulse width of symbols in a biphase mark encoded signal are used to recover a clock and data from a variable rate biphase mark encoded digital audio signal, as described below.

In particular, clock and data recovery generally means recovery of a clock signal that is synchronous with what is generally considered an unencoded digital data stream. Such a stream may be a non-return to zero (NRZ) encoded data stream. Using NRZ, a logic 1 bit is sent as a high value and a logic 0 bit is sent as a low value.

Figure 2:
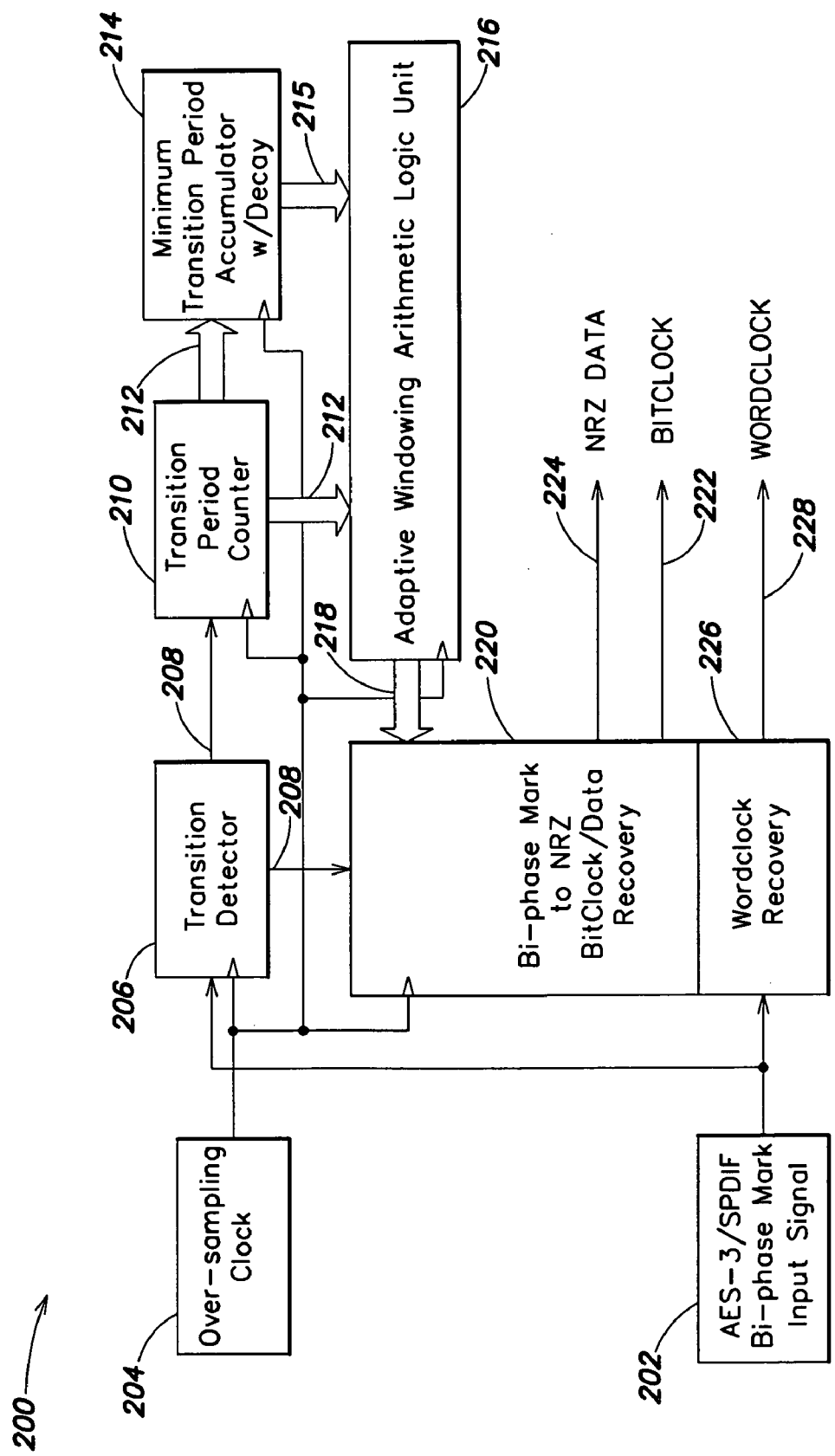
FIG. 2 is a block diagram of an example receiver.

Referring now to FIG. 2, a block diagram of a circuit 200 for recovering a clock and data from an input variable rate biphase mark encoded digital audio signal 202 will now be described. This circuit includes an over-sampling clock 204, which is a high speed clock signal. The high speed clock signal should be significantly higher than the data rate that the receiver is expected to receive. For example, AES-3 specifies sample rates in the range of 32 kHz to 192 kHz. Thus, the over-sampling clock should have a rate of at least three or four times, but preferably up to ten times, the highest bit rate, such as about 60 MHz for AES-3 audio. The over-sampling clock is received by the other components in the circuit of FIG. 2 as described in more detail below.

Both the input digital audio signal and the high speed clock signal are applied to inputs of a transition detector 206. The transition detector has an output, synchronous with the oversampling clock, which provides an edge signal 208 indicative of points in time in the input digital audio signal at which a transition in signal level occurs.

This edge signal 208 is applied to a reset input of a transition period counter 210. In response to the edge signal indicating that a transition in the input signal has been detected, the output of the counter 210 is stored in a register or latch and the counter resets itself. The over-sampling clock is applied to an increment input of the counter 210. In response to each rising or falling edge of the oversampling clock, depending on implementation of the counter, the counter increments its output value. Thus, the output value of the counter provides a count that increments at the rate of the over-sampling clock, and resets upon each transition of the input signal. Thus, when the output of the counter 210 is stored upon each transition of the input signal, it provides a measure of a duration 212 of the most recent pulse in the input signal 202.

The duration 212 of the most recent pulse, as output by the transition period counter 210, is input to a minimum transition period accumulator 214 (with decay). This accumulator identifies, stores and outputs (as indicated at 215) an extremum of the counter over a period of time. In the following example, use of a minimum value will be described. A maximum value also may be used. The stored minimum value is indicative of a bit clock for data in the input signal, by virtue of its representation of the shortest pulse width which is one half the period of the bit clock.

It will be noted that if the data rate of the input signal becomes faster, the shortest pulse will become shorter and the minimum value stored by the logic will become shorter. If the data rate of the input signal becomes slower, the longest pulse will become longer and any maximum value stored by the logic will become longer. However, if a minimum is stored and the input signal becomes slower, or if a maximum is stored and the input signal becomes faster, the stored minimum or maximum values would not otherwise change. Therefore accumulator 214 incorporates decay, which means that the stored value changes over time towards a larger value (if a minimum is stored) or a smaller value (if a maximum is stored) to a limit. As an example implementation, if a current duration 212 is greater than a maximum anticipated duration, then the stored minimum value is incremented. For example, in an AES-3 signal, the maximum pulse width is generally three times the minimum pulse width. Therefore, the maximum anticipated duration of a pulse will be slightly more than three times the stored minimum pulse width.

The minimum or maximum value 215 from the accumulator 214 and the duration 212 of the most recent pulse output by the transition period counter 210 are input to an adaptive windowing arithmetic logic unit 216. This logic unit 216 defines a window 218 in time in which the biphase mark to NRZ bitclock recovery block 220 looks for a transition in the input signal 202 (which is indicated by the edge signal 208 from transition detector 206).

The recovery block 220 receives as an input the window 218 specified by the adaptive windowing arithmetic logic unit 216. This recovery block 220 provides one or more sampling clocks for sampling the digital audio signal, including, for example a bit clock 222 and the data 224.

How the logic unit 216 and recovery block 220 work together to generate the bit clock and data will now be explained in more detail. Given a shortest pulse width T of an input signal, after a transition in the input signal occurs, any subsequent transition will occur either around time T later or around time 2T later. Based on the next transition, the value of the current data can be determined. In particular, if the next transition occurs around time T, that transition indicates the current data bit has a value of one. If the next transition occurs around time 2T, that transition indicates that both the current data has a value of zero. The bit clock is driven by changing the state of a clock signal based on the edge signal 208. If the edge signal indicates a transition occurring around time T, that transition is ignored for the bit clock. Thus, only transitions occurring every 2T are used to generate the bit clock. The bit clock thus has a period of 2T.

Figure 3:
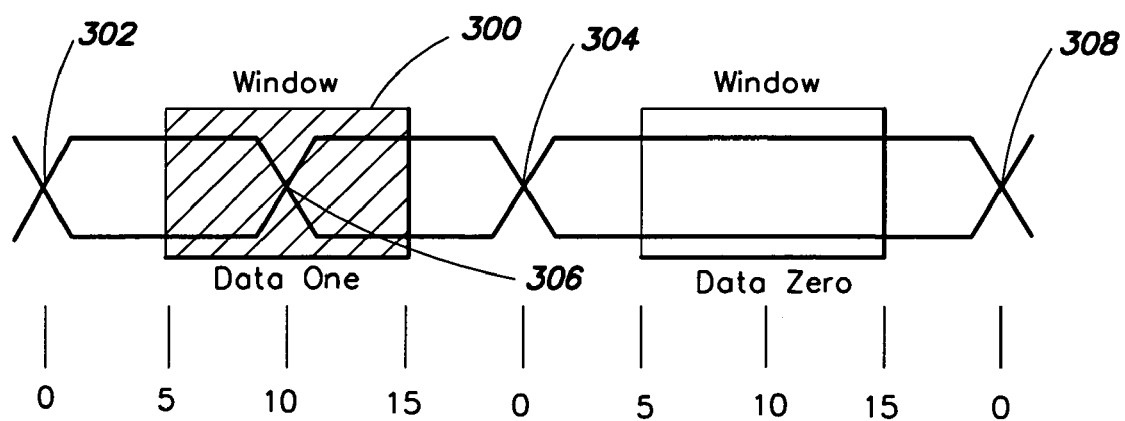
FIG. 3 is an illustration of how a window relates to a received signal.

A more particular explanation and example will now be provided in connection with FIG. 3. A window 300 is defined based on the minimum period 1T, derived from the output of the accumulator 214 (FIG. 2). This window is centered over a period of 2T starting after a transition 302. If the window is 1T wide, it will start at about one-quarter into such a 2T period and will end at about three-quarters into the 2T period. The recovery block 220 (FIG. 2) tests for a transition in the middle of this window, which would represent a data one if such a transition 306 occurs, and a data zero if such a transition does not occur. If the window is 1T wide, the start position of the window is defined by dividing the current 1T count by 2. The window is then open for a period of 1T. Therefore, the recovery block 220 (FIG. 2) obtains the window width (e.g., T) and the window position (e.g., its start position T/2) from the logic unit 216 (FIG. 2), then monitors the edge signal 208 (FIG. 2) for an indication of a transition during this window.

As a specific example, with input data at 48 kHz, the shortest pulse width corresponds to a rate of 6.144 MHz. (128×48K). With an over-sampling clock of 66 MHz, the minimum transition accumulator count would be at about 10, (66 MHz/6.144 Mhz=10.742 rounded down to 10 using integer math). The 2T and 3T periods are derived by multiplying this count of 10 by 2 and 3 respectively. Of course, these values scale up and down with the incoming data rate. Using these example rates, the window 300 start position would begin at a count of 5 periods of the oversampling clock 204 after a first transition and would end at a count of 15 periods of the oversampling clock after that first transition. A next transition should occur at a count of about 10 or at a count of about 20, depending on whether the data represents a zero (e.g., as with transition 308 following transition 304) or a one (as with transition 306 following transition 302).

Thus, referring again to FIG. 2, the recovery block 220, given a window size and window position 218, looks for a transition to occur (as indicated by the edge signal 208 from the transition detector 206) in a certain window of time after a transition. If the transition occurs in the window, a data one is output, but the state of the bit clock signal is not changed by the edge signal 208. If no transition occurs in the window, then a data zero is output and a change in state of the bit clock signal is changed by the edge signal 208. The bit clock 222 and data 224 as a result also are synchronous with the oversampling clock 204.

Given the bit clock and recovered data, this information can be stored and/or provided to a digital audio processing system.

In some instances, the biphase mark encoded data may be included in other digital data that may provide additional information that also may be stored and/or used by the digital audio processing system. For example, for an input AES-3 stream, biphase mark encoded data for a word of audio data is packaged among other data that includes one or more pieces of information called a preamble. The preamble indicates a top of frame of data and may be used by a word clock generator 226 to generate a word clock signal as indicated at 228. With such data, a receiver first locks to the input data, then identifies and processes the biphase mark encoded data that it includes. For AES-3 data, the minimum pulse width (T) enables the receiver to determine a value for 3T, which is the width of a pulse in the top of frame preamble in AES-3 data. Such preambles are specified to occur at known positions in the AES-3 data stream. Thus the word clock recovery circuit 226 can use the value T to define a window positioned at a specified time to detect the occurrence of the top of frame preamble. The transition that is unique to the top of frame preamble can be passed directly through, without synchronization with the oversampling clock 204, to provide a word clock that is asynchronous with the recovered clock and data.

By using such adaptive windowing, the receiver 200 can readily synchronize to input data of any rate. The range of data rates that it can handle is limited only by the maximum counter size and the rate of the oversampling clock 204. The adaptive windowing based on an accumulated minimum (or maximum) value with decay also allows for the data rate to change during use, without requiring a phase-locked loop to recover the clock signal. Thus, the receiver 200 may be used in a number of different environments.

Because of the adaptive windowing used to set the bit clock, the receiver 200 also exhibits very high jitter tolerance. Such jitter tolerance is particularly beneficial when recovering signals with high phase noise, which is a common problem with long cable runs. This benefit will make the receiver particularly useful in live sound environments.

Having now described an example embodiment, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention.

What is claimed is:

1. Apparatus for recovering a clock and data from a variable rate signal including biphase mark encoded digital audio data, comprising:

an edge detector having an input for receiving the variable rate signal and an output providing an edge signal indicative of points in time in the variable rate signal at which a transition in signal level occurs;

a counter having a reset input connected to receive the edge signal from the edge detector, an increment input connected to receive a high speed clock signal and an output providing a count that increments at the rate of the high speed clock signal;

logic for identifying an extremum pulse width from the counter over a period of time; and a clock and data generator responsive to the extremum pulse width and the edge signal to generate a recovered clock and to provide recovered data in synchronization with the recovered clock.

2. The apparatus of claim 1, wherein the clock and data generator includes an adaptive windowing arithmetic logic unit for specifying a window using the extremum pulse width; and a bitclock and data recovery block for determining whether a transition occurs during the specified window and generating the recovered data based on the determination.

3. The apparatus of claim 2, wherein the logic for identifying an extremum pulse width includes an accumulator for updating the extremum pulse width for each edge in the input signal, and for decaying the extremum pulse width over time.

4. The apparatus of claim 1, wherein the logic for identifying an extremum pulse width includes an accumulator for updating the extremum pulse width for each edge in the input signal, and for decaying the extremum pulse width over time.

5. The apparatus of claim 1, wherein the extremum is a minimum.

6. A method for recovering a clock and data from a variable rate signal including biphase mark encoded digital audio data, comprising:

regularly identifying an extremum pulse width in the variable rate signal;

specifying a window using the extremum pulse width;

determining whether a transition occurs during the specified window; and generating a recovered clock and recovered data in synchronization with the recovered clock based on the determination.

7. The method of claim 6, wherein regularly identifying an extremum pulse width comprises:

detecting transitions in the variable rate signal;

counting pulses of an over-sampling clock between detected transitions; and storing an extremum of the counted pulses for each transition over a period of time.

8. The method of claim 7, wherein storing comprises:

updating the extremum pulse width for each transition in the variable rate signal; and decaying the extremum pulse width over time.

* * * * *